United States Patent

Steigman et al.

[15] 3,686,544

[45] Aug. 22, 1972

[54] MOSFET WITH DUAL DIELECTRIC OF TITANIUM DIOXIDE ON SILICON DIOXIDE TO PREVENT SURFACE CURRENT MIGRATION PATH

[72] Inventors: Peter Edward Steigman, Cottingham; Frank Robert Badcock, Harrow, Middlesex; David Robert Lamb, Hanworth, Middlex, all of England

[73] Assignee: U.S. Philips Corporation, New York, N.Y.

[22] Filed: Feb. 10, 1969

[21] Appl. No.: 797,964

[52] U.S. Cl.......317/235 R, 317/235 B, 317/235 AG, 317/235 AF

[51] Int. Cl...............................................H01l 11/14

[58] Field of Search......317/235 B, 235 AH, 235 AZ

[56] References Cited

UNITED STATES PATENTS

| | | | |
|---|---|---|---|
| 3,491,433 | 1/1970 | Kawamura et al. | 29/570 |
| 3,396,052 | 8/1968 | Rand | 117/201 |
| 3,436,623 | 4/1969 | Beer | 317/235 |
| 3,463,974 | 8/1969 | Kelley et al. | 317/235 |

*Primary Examiner*—Martin H. Edlow
*Attorney*—Frank R. Trifari

[57] ABSTRACT

An insulated gate field effect transistor is described having a titanium dioxide surface layer over the usual insulating layer to interrupt surface charge migration between its source and drain.

5 Claims, 2 Drawing Figures

Patented Aug. 22, 1972 3,686,544

Figure 1:
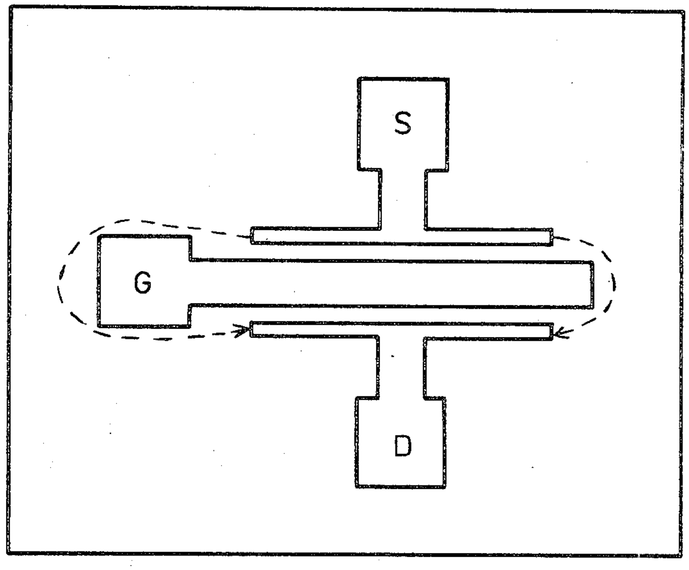

INVENTORS
PETER E. STEIGMAN
FRANK R. BADCOCK
BY DAVID R. LAMB
Frank R. Trifari
AGENT

MOSFET WITH DUAL DIELECTRIC OF TITANIUM DIOXIDE ON SILICON DIOXIDE TO PREVENT SURFACE CURRENT MIGRATION PATH

The invention relates to a semiconductor device comprising an insulated gate field effect transistor and to methods of manufacturing such devices.

An insulated gate field effect transistor is to be understood to mean herein a high resistivity semiconductor body or body part of one conductivity type, two spaced, low resistivity regions of the opposite conductivity type extending in the body or body part from one surface thereof and defining in the body or body part between the low resistivity regions a current carrying channel region adjacent the one surface, a gate electrode situated on the one surface between the low resistivity regions and separated from the one surface by an insulating layer present on the one surface, and ohmic contact electrodes on the one surface to the low resistivity regions. The two low resistivity regions are referred to as the source and drain regions. The insulated gate field effect transistor may form part of a semiconductor integrated circuit.

One commonly known form of such a transistor is the Metal-Oxide-Semiconductor-Transistor, generally referred to as the MOST. In this device generally the semiconductor body or body part is of silicon and the gate electrode is spaced from the silicon surface by an insulating layer of silicon oxide. In operation the applied voltage between the source and drain regions is such that the PN junction between the drain and the substrate is reverse biased. Current flow between the source and drain regions is controlled in accordance with the voltage applied between the source region and the gate electrode. In the so-called enhancement mode, on application of a voltage of suitable polarity to the gate electrode a current flow is initiated between the source and drain. In one configuration of the transistor suitable for use in the enhancement mode the voltage applied to the gate causes a surface inversion layer to be formed in the semiconductor body below the insulating layer in the current carrying channel region between the source and drain regions. MOST's may also be prepared which operate in the so-called depletion mode. In these devices current flow between the source and drain occurs with no applied voltage in the gate electrode. The concentration of charge carriers in the current carrying channel region is decreased by the application of a voltage of suitable polarity to the gate electrode. Such a device may also be operated in the enhancement mode by increasing the concentration of charge carriers in the current carrying channel region by the application of a voltage of suitable polarity to the gate electrode. This invention is particularly but not exclusively concerned with insulated gate field effect transistors constructed for operation in the enhancement mode.

The manufacture of a MOST generally involves the formation of the low resistivity source and drain regions by diffusion techniques. For example, in the manufacture of a P-channel silicon MOST having an N-type silicon substrate, the $P^+$-type source and drain regions are formed by diffusion of an acceptor element, for example, boron, into limited surface portions of the silicon surface exposed by openings formed in a silicon oxide layer on the surface. The silicon oxide layer may then be removed and a fresh silicon oxide layer provided on the surface. Openings are formed in the fresh silicon oxide layer to expose the source and drain regions. A metal layer, for example of aluminum, is deposited in these openings and on the remainder of the surface of the silicon oxide layer. Thereafter the metal layer is selectively removed by photoengraving techniques to leave metal contact electrode layers to the source and drain regions and a gate electrode metal layer on the silicon oxide layer.

In MOST's constructed for operation in the enhancement mode it is desired to obtain stabilization of the device properties with respect to the applied gate voltage at which conduction first occurs. It is found that such stability is not always acchieved in practice, for example in a P-channel enhancement type device operation with large negative gate voltages over long periods results in a permanent drain current occurring when the gate voltage is reduced to zero. In a typical example, operation for up to 50 hours results in a permanent drain current of 8 to 10 $\mu$A. This permanent drain current at zero gate voltage can be attributed to the migration of surface charges in or on the region of the insulating layer situated between the source and drain electrodes. The main path for such surface charge migration lies external to the gate electrode between adjacent end portions of the source and drain electrodes.

Surface charges are understood to mean herein charges that may be present, for example, as ion charges, in or on the insulating layer or at the boundary between the insulating layer and the semiconductor body.

FIG. 1 of the accompanying drawing shows in plan view the semiconductor body of a P-channel, silicon enhancement type MOST.

The source, drain and gate electrodes are identified with the letters S, D and G respectively and each comprises an elongated portion in the vicinity of the active region of the device and a large area terminal portion on which a connecting wire is bonded. The surface part of the body not covered by the electrodes is covered with an insulating layer of silicon oxide. Between the adjacent ends of the elongated portions of the source and drain electrodes there is indicated in dotted outline two possible paths for surface charge migration on the surface of the silicon oxide layer. The effect of the residual drain current with zero gate voltage can be attributed to such migration along these paths, the contribution due to the shorter of the two paths being approximately three times that due to the longer of the two paths.

It will be appreciated that the residual drain current due to the said migration is dependent upon the geometry of the device, particularly with respect to the electrode configuration. Generally the effect will be more pronounced with long open ended source and drain electrodes but it may still occur in devices in which the drain electrode lies internally of the gate electrode due to a leakage path.

According to a first aspect of the invention an insulated gate field effect transistor comprises a surface layer of titanium dioxide on the insulating layer at such an area of said insulating layer beyond the gate electrode as to interrupt a path for surface charge migration thereon between the source and drain electrodes.

It is found that in such a device, by the provision of the surface layer of titanium dioxide, the residual drain current at zero gate voltage which appears after several hours operation can be substantially reduced. The action of the titanium dioxide layer is to trap the mobile surface charges. In one example, in a P-channel enhancement type silicon MOST a residual drain current of 8 – 10 $\mu$A is reduced to 50 nanoamps by the provision of the titanium dioxide layer, on the same time scale.

Substantial reduction of the residual drain current is obtained when the surface layer of titanium dioxide is situated on the insulating layer at an area thereof to interrupt a path for surface charge migration lying between the source and drain electrodes external to the gate electrode.

In a preferred form of an insulated gate field effect transistor the titanium dioxide surface layer is situated on the whole surface part of the insulating layer beyond the gate electrode. The titanium dioxide surface layer may additionally extend on the source, drain and gate electrodes.

In a preferred form of the insulated gate field effect transistor, the semiconductor body or body part is of silicon and the insulating layer is of silicon oxide. It is found that good stabilization of the electrical properties of such a device is obtained by the provision of the titanium dioxide surface layer. Furthermore an advantage arises in that the titanium dioxide layer can be applied by a relatively low temperature process. It may be applied by a low temperature chemical deposition process, for example, by a vapor phase hydrolysis of titanium tetrachloride at a temperature of 150° to 200° C. Alternatively the titanium dioxide may be applied by sputtering.

According to a second aspect of the invention, in a method of manufacturing an insulated gate field effect transistor, subsequent to providing the source, drain and gate electrodes, a layer of titanium dioxide is deposited on the exposed surface of the insulating layer at such an area thereof beyond the gate electrode as to interrupt a path for surface charge migration thereon between the source and drain electrodes.

The titanium dioxide layer may be deposited on the whole exposed surface part of the insulating layer and on the exposed surface of the source, drain and gate electrodes. This deposition may occur subsequent to providing conductive connections to the electrodes for example, in the form of wires bonded to the electrodes. However, in order to avoid shadow effects it is preferable to deposit the titanium dioxide before making these connections, the deposited layer being selectively removed, for example, by a photomasking and etching process, to expose surface portions of the source, drain and gate electrodes and the conductive connection being made subsequently to said exposed portions.

An embodiment of an insulated gate field effect transistor according to the invention will now be described, by way of example, with reference to FIG. 2 of the accompanying diagrammatic drawing which shows in plan view the semiconductor body of said transistor.

Figure 2:
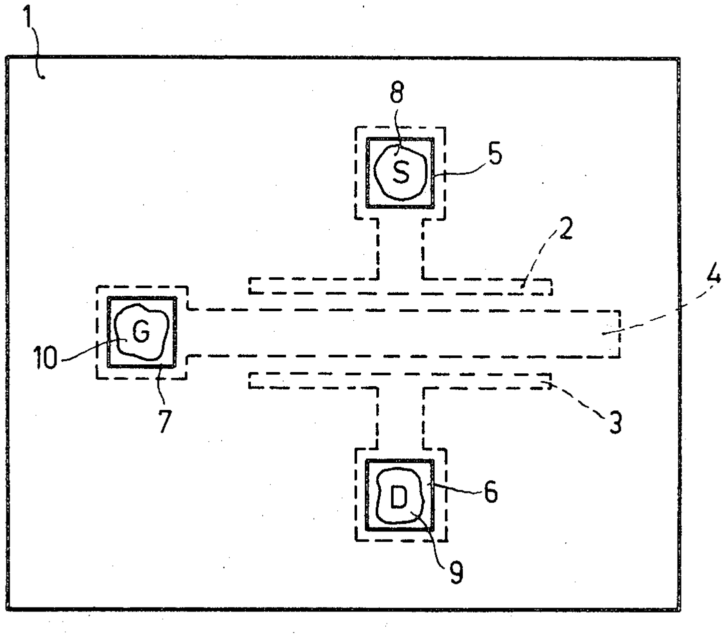

The P-channel enhancement type silicon MOST shown in FIG. 2 is identical to that shown in FIG. 1 with respect to the size of the semiconductor body, the various regions in the body and the configuration of the source, drain and gate electrodes. The difference lies in the provision of a surface layer 1 of titanium dioxide of 0.2 $\mu$ thickness on the previously exposed surface portions of the insulating layer of silicon oxide and on the surfaces of the aluminum source, drain and gate electrodes. The source drain and gate electrodes 2, 3 and 4 respectively are located below the titanium dioxide layer and are shown in FIG. 2 in dotted outline. In the titanium dioxide layer 1 there are openings 5, 6, 7, exposing the large area bonding pad regions of the source, drain and gate electrodes respectively. The area of each aluminum bonding pad is 100 $\mu \times$ 100 $\mu$ and the openings 5, 6 and 7 in the titanium dioxide layer 1 each are of 80 $\mu \times$ 80 $\mu$.

On the exposed portions of the bonding pads there are thermocompression bonded wires 8, 9 and 10 forming external connection to the source, drain and gate electrodes respectively.

The manufacture of the insulated gate field effect transistor shown in FIG. 2 will now be described so far as is relevant to the method according to the invention. At a stage in the transistor manufacture after the aluminum source, drain and gate electrodes 2, 3 and 4 have been defined, the silicon body is placed in a furnace tube of approximately 10 sq. cm. cross section. A zone of the furnace tube of approximately 10 cm. length and containing the silicon body is heated at 150° to 200° C. A gas stream consisting of wet oxygen at a flow rate of 10 liters per minute and oxygen saturated with titanium tetrachloride at a flow rate of 500 cc. per minute is passed through the tube. The latter component of the gas stream is obtained by passing oxygen over the surface of liquid titanium tetrachloride at room temperature. In the heated zone hydrolysis of the titanium tetrachloride occurs and titanium dioxide deposits on the exposed surface of the body at a rate of 500 A. per minute. The gas stream component containing titanium tetrachloride is maintained for approximately 4 minutes during which time a titanium dioxide surface layer of 0.2 $\mu$ is obtained.

The silicon body is removed from the furnace tube and a photomasking and etching process is carried out to expose portions of the aluminum bonding pads. The etchant used is hydrofluoric acid. Thereafter the silicon body, usually in the form of a large area slice comprising a plurality of MOST subassemblies, is divided up and on each MOST the usual wire bonding and encapsulation techniques are carried out.

It will be appreciated that alternatively it is possible to effect the titanium dioxide deposition after wire bonding. This removes the titanium dioxide photomasking and etching stage but involves the disadvantage of having to handle separate units in the furnace tube whereas in the method described a plurality of MOST subassemblies on the one slice are treated simultaneously.

What is claimed is:

1. In a semiconductor device comprising an insulated gate field effect transistor having a semiconductor body, spaced source and drain electrode connections to the body on opposite sides of a channel region, an insulating layer of other than titanium dioxide on the body, and a gate electrode on the insulating layer and having a portion overlying the channel region, the improvement comprising a surface layer of titanium dioxide on the insulating layer at least at areas thereof beyond the gate electrode and capable of interrupting a path thereon for surface charge migration between the source and drain electrodes.

2. A semiconductor device as set forth in claim 1 wherein the source and drain electrodes have a linear elongated form, and the titanium dioxide surface layer is provided at least at the area along the edges of the source and drain electrodes and just outside of the gate electrode.

3. A semiconductor device as set forth in claim 1 wherein the titanium dioxide surface layer is located on the whole surface part of the insulating layer beyond the gate electrode.

4. A semiconductor device as set forth in claim 3 wherein the titanium dioxide surface layer also extends over the source, drain and gate electrodes.

5. A semiconductor device as set forth in claim 1 wherein the semiconductor body is of silicon, and the insulating layer is of silicon oxide.

* * * * *